US012593645B2

(12) United States Patent
Jung et al.

(10) Patent No.: US 12,593,645 B2
(45) Date of Patent: Mar. 31, 2026

(54) LIQUID TRAP TANK AND LIQUID SUPPLY UNIT FOR THE LIQUID TRAP TANK

(71) Applicant: SEMES CO., LTD.,
Chungcheongnam-do (KR)

(72) Inventors: Woo Sin Jung, Chungcheongnam-do (KR); Young Choi, Chungcheongnam-do (KR); Dae Sung Kim, Chungcheongnam-do (KR); Hae Kyung Kim, Chungcheongnam-do (KR); Dongwoon Park, Seoul (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 681 days.

(21) Appl. No.: 17/990,819

(22) Filed: Nov. 21, 2022

(65) Prior Publication Data

US 2023/0215745 A1     Jul. 6, 2023

(30) Foreign Application Priority Data

Dec. 31, 2021    (KR) ........................ 10-2021-0194305

(51) Int. Cl.
*H01L 21/67* (2006.01)
*B05C 11/10* (2006.01)
(52) U.S. Cl.
CPC ...... *H01L 21/6715* (2013.01); *B05C 11/1047* (2013.01); *H01L 21/67017* (2013.01)
(58) Field of Classification Search
CPC ........... H01L 21/6715; H01L 21/67017; H01L 21/6704; H01L 21/67075; B05C 11/1047; F15D 1/002–0055
See application file for complete search history.

(56) References Cited

U.S. PATENT DOCUMENTS 6,021,921 A * 2/2000 Lan ...................... B67D 7/0261
222/394
6,423,139 B1 7/2002 Shimai et al.
(Continued)

FOREIGN PATENT DOCUMENTS

JP          H03-15396 U      2/1991
JP          H11-154641 A     6/1999
(Continued)

OTHER PUBLICATIONS

Korean Office Action issued in corresponding KR Patent Application No. 10-2021-0194305, dated Aug. 23, 2023, pp. 1-5.
(Continued)

*Primary Examiner* — Dah-Wei D. Yuan
*Assistant Examiner* — Stephen A Kitt
(74) *Attorney, Agent, or Firm* — Carter, DeLuca & Farrell LLP

(57) ABSTRACT

A liquid trap tank and a liquid supply unit for the liquid trap tank are provided. The liquid trap tank includes a tank body which has an accommodating space formed therein to accommodate a liquid and has an inlet portion formed on one side and an outlet portion formed on an opposite side; and a liquid supply unit coupled to the inlet of the tank body to supply the liquid from the outside of the tank body to the accommodating space, wherein the liquid supply unit comprises an inlet pipe portion coupled to the inlet portion to introduce the liquid into the accommodating space and a flow directing portion connected to the inlet pipe portion and configured to induce a flow of the liquid to suppress generation of air bubbles due to a drop of the liquid passing through the inlet pipe portion.

14 Claims, 11 Drawing Sheets

(56)        References Cited

U.S. PATENT DOCUMENTS

| | | | |
|---|---|---|---|
| 9,922,850 | B2 | 3/2018 | Kwon et al. |
| 2004/0159400 | A1* | 8/2004 | Kim ...................... B05C 11/101 |
| | | | 257/E21.259 |
| 2010/0058985 | A1 | 3/2010 | Kim et al. |
| 2020/0357662 | A1 | 11/2020 | Muta et al. |

FOREIGN PATENT DOCUMENTS

| | | | |
|---|---|---|---|
| JP | 2000-058499 | A | 2/2000 |
| JP | 2004-327638 | A | 11/2004 |
| JP | 2007-035733 | A | 2/2007 |
| JP | 2011-022189 | A | 2/2011 |
| JP | 2016-117235 | A | 6/2016 |
| KR | 10-2008-0065453 | A | 7/2008 |
| KR | 10-2008-0089155 | A | 10/2008 |
| KR | 10-2010-0030275 | A | 3/2010 |
| KR | 10-2011-0091314 | A | 8/2011 |
| KR | 10-1570168 | B1 | 11/2015 |
| KR | 10-2020-0130156 | A | 11/2020 |

OTHER PUBLICATIONS

Notice of Reasons for Refusal issued by the Japanese Patent Office on Dec. 5, 2023 in corresponding JP Patent Application No. 2022-180920, with English translation.

* cited by examiner

LIQUID TRAP TANK AND LIQUID SUPPLY UNIT FOR THE LIQUID TRAP TANK

CROSS-REFERENCE TO RELATED APPLICATION(S)

This application claims the benefit under 35 USC § 119(a) of Korean Patent Application No. 10-2021-0194305, filed on Dec. 31, 2021, in the Korean Intellectual Property Office, the entire disclosure of which is incorporated herein by reference for all purposes.

BACKGROUND

1. Field

The following description relates to a semiconductor device, and more particularly, to a liquid trap tank and a liquid supply unit for the liquid trap tank.

2. Description of Related Art

Various apparatuses for treating a substrate are used for manufacturing semiconductor devices. These apparatuses for treating a substrate use a variety of liquids. For example, a cleaning solution, distilled water, an etching solution, etc. may be used for cleaning or etching a substrate, and a liquid chemical such as photoresist may be used for photoresist coating on the substrate.

In manufacture of a semiconductor device, these liquids may be provided through separate liquid storage devices or liquid storage bottles in a fabrication plant. When the liquids are provided to the apparatus for treating a substrate or supplied onto the substrate, air bubbles may be included. However, as the pattern of a semiconductor device becomes fined, such air bubbles may deteriorate the quality of the semiconductor device. Therefore, there is a need to suppress the generation of air bubbles in a liquid in a liquid supply system or to remove air bubbles from the liquid before supplying the liquid onto a substrate.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a liquid trap tank capable of suppressing the generation of air bubbles or allowing air bubbles to be removed, and a liquid supply unit for the liquid trap tank.

In one general aspect, there is provided a liquid trap tank including a tank body which has an accommodating space formed therein to accommodate a liquid and has an inlet portion formed on one side and an outlet portion formed on an opposite side, and a liquid supply unit coupled to the inlet of the tank body to supply the liquid from the outside of the tank body to the accommodating space, wherein the liquid supply unit includes an inlet pipe portion coupled to the inlet portion to introduce the liquid into the accommodating space and a flow directing portion connected to the inlet pipe portion and configured to induce a flow of the liquid to suppress the generation of air bubbles due to a drop of the liquid passing through the inlet pipe portion.

According to the liquid trap tank, the inlet pipe portion may be a full pipe with a side surface entirely closed, and the flow direction portion may include a partial pipe having a shape in which at least a part of an inner portion is partially open in a lateral direction.

According to the liquid trap tank, the partial pipe may be formed at least at an upper end of the flow directing portion.

According to the liquid trap tank, the flow directing portion may extend vertically from an upper side direction to a lower side direction of the tank body, and the partial pipe may be formed along an entire length from an upper end to a lower end of the flow directing portion.

According to the liquid trap tank, the flow directing portion may further include an inclined connecting portion to remove a step difference in the upper end connected to the inlet pipe portion.

According to the liquid trap tank, the flow directing portion may be in contact with a bottom surface of the tank body.

According to the liquid trap tank, the partial pipe may be a half pipe exposed in a lateral direction thereof, and the flow directing portion may guide the liquid passing through the inlet pipe portion to form a laminar flow.

According to the liquid trap tank, a plurality of partial pipes may be formed to be spaced apart from each other in a longitudinal direction of the flow directing portion.

According to the liquid trap tank, the flow directing portion may further include any one of a perforation hole and a protrusion pattern or a combination thereof on at least a portion of an inner surface thereof in order to reduce a flow rate of the liquid.

According to the liquid trap tank, the inlet portion may be formed at a top portion of the tank body, the outlet portion may be formed at a bottom portion of the tank body, and the inlet pipe portion may penetrate through the top portion of the tank body and extend up to below a full level of the tank body so that the liquid in an amount equal to the amount discharged through the outlet portion can be naturally sucked in through the inlet portion.

According to the liquid trap tank, the flow directing portion may be connected to the inlet pipe portion above the middle of the tank body so that air bubbles introduced through the inlet pipe portion can rise to the upper portion of the tank body without moving toward the outlet portion.

According to the liquid trap tank, the outlet portion may be connected to a pumping unit configured to pump the liquid to a substrate treatment apparatus, and the inlet portion may be connected to a liquid storage bottle that stores the liquid.

In another general aspect, there is provided a liquid supply unit for a liquid trap tank, which is coupled to an inlet portion of a tank body that has an accommodating space formed therein to accommodate a liquid and has the inlet portion formed on one side and an outlet portion formed on an opposite side and configured to supply the liquid to the accommodating space from the outside of the tank body, the liquid supply unit including an inlet pipe portion coupled to the inlet portion to introduce the liquid into the accommodating space and a flow directing portion connected to the inlet pipe portion and configured to induce a laminar flow of the liquid to suppress the generation of air bubbles due to a drop of the liquid passing through the inlet pipe portion.

In still another general aspect, there is provided a liquid trap tank including a tank body which has an accommodating space formed therein to accommodate a liquid and has an inlet portion on one side thereof which is connected to a liquid storage bottle and an outlet portion on an opposite side which is connected to a pumping unit, and a liquid supply unit coupled to the inlet portion of the tank body to supply the liquid from the outside of the tank body to the accommodating space, wherein the liquid supply unit includes an inlet pipe portion coupled to the inlet portion, extending into the accommodating space to introduce the liquid into the accommodating space, and including a full pipe with a side surface entirely closed and a flow directing portion connected to the inlet pipe portion in the accommodating space, vertically extending from an upper side direction to a lower side direction of the tank body, and including a partial pipe having a shape in which an entire inner portion from an upper end to a lower end is partially open in a lateral direction such that a flow of the liquid can be induced to suppress the generation of air bubbles due to a drop of the liquid passing through the inlet pipe portion, the inlet pipe portion extends below a full level of the tank body so that the liquid in an amount equal to the amount discharged through the outlet portion can be naturally sucked in through the inlet portion, and the flow directing portion is connected to the inlet pipe portion above the middle of the tank body so that air bubbles introduced through the inlet pipe portion can rise to an upper portion of the tank body without moving toward the outlet portion.

Other features and aspects will be apparent from the following detailed description, the drawings, and the claims.

Figure 1:
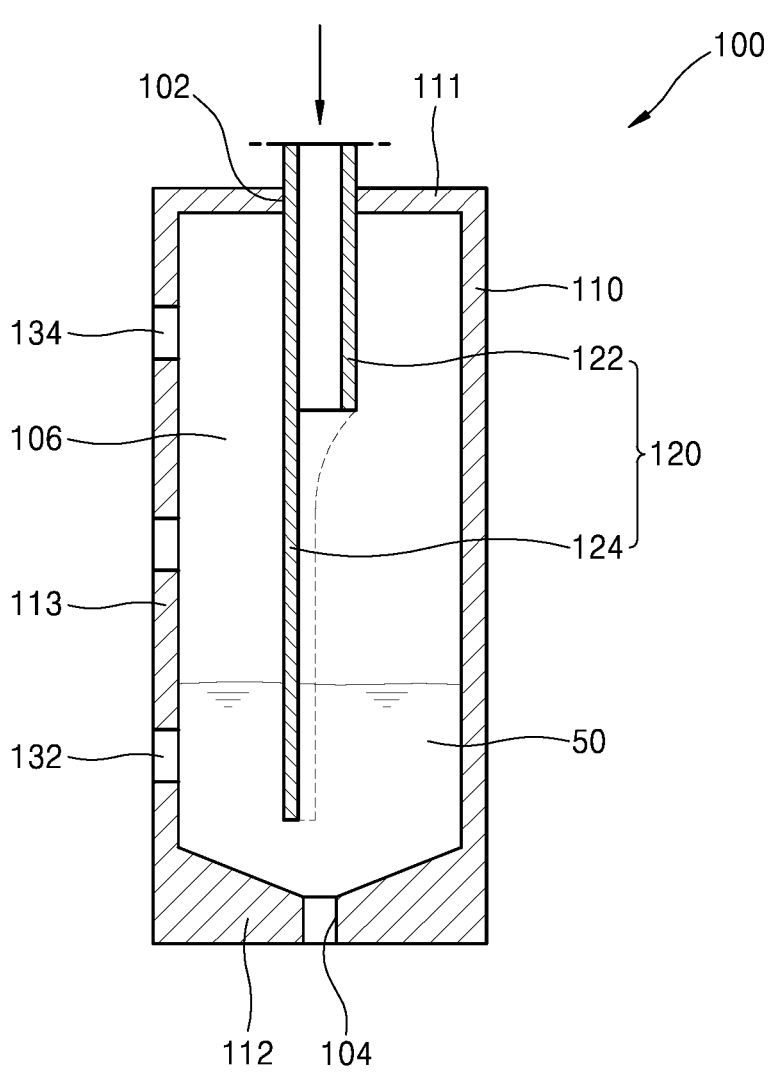
FIG. 1 is a schematic cross-sectional view of a liquid trap tank according to an embodiment of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, embodiments of the present disclosure will be described in detail with reference to the accompanying drawings.

The present disclosure may be embodied in many different forms and should not be construed as being limited to the embodiments set forth herein. Rather, these embodiments are provided so that this disclosure will be thorough and complete, and will fully convey the concept of the invention to one of ordinary skill in the art. Also, thickness or sizes of layers in the drawings are exaggerated for convenience of explanation and clarity.

Hereinafter, the present disclosure will be described more fully with reference to the accompanying drawings, in which exemplary embodiments of the present disclosure are shown. In the drawings, for example, according to the manufacturing techniques and/or tolerances, shapes of the illustrated elements may be modified. Thus, the present disclosure should not be construed as being limited to the embodiments set forth herein, and should include, for example, variations in the shapes caused during manufacturing.

FIG. 1 is a schematic cross-sectional view of a liquid trap tank 100 according to an embodiment of the present disclosure.

Referring to FIG. 1, a liquid trap tank 100 may include a tank body 110 and a liquid supply unit 120.

More specifically, the liquid trap tank 100 may receive a liquid 50 from the outside, accommodate the liquid 50 therein, and discharge the liquid 50 to the outside again. The liquid 50 may include various liquid chemicals used for semiconductor treatment, such as a cleaning solution, an etching solution, and photoresist. In some embodiments, the liquid 50 may be construed to further include distilled water in addition to the liquid chemicals.

The tank body 110 may have an accommodating space 106 formed therein to accommodate the liquid 50. The tank body 110 may have a cylindrical shape with an empty inside and the inside of the tank may be the accommodating space 106. For example, the tank body 110 may have a cylindrical shape or a polygonal cylindrical shape, such as a triangular cylinder, a rectangular cylinder, or the like.

Further, a tank body 110 may have an inlet portion 102 formed on one side and an outlet portion 104 formed on the opposite side. The liquid may be introduced from the outside through the inlet portion 102 and discharged through the outlet portion 104. For example, the inlet portion 102 may be formed at a top portion 111 of the tank body 110 and the outlet portion 104 may be formed at a bottom portion 112 of the tank body 110.

In some embodiments, the inlet portion 102 may refer to an inlet hole formed at the top portion 111, and the outlet portion 104 may refer to an outlet hole formed at the bottom portion 112.

Additionally, the tank body 110 may include an empty level indicating portion 132 and a full level indicating portion 134 to display the level of the liquid 50. For example, the empty level indicating portion 132 may be formed at a lower end of a lateral portion 113 of the tank body 110, and the full level indicating portion 134 may be formed at an upper end of the lateral portion 113 of the tank body 110. Further, the empty level indicating portion 114 and the full level indicating portion 112 may each have a level sensor (not shown) to detect a level of a liquid.

The liquid supply unit 120 may be coupled to the tank body 110 to supply the liquid 50 to the tank body 110. For example, the liquid supply unit 120 may be coupled to the inlet portion 102 of the tank body 110 to supply the liquid 50 from the outside of the tank body 110 to the accommodating space 106.

More specifically, the liquid supply unit 120 may include an inlet pipe portion 122 and a flow directing portion 124. For example, the inlet pipe portion 122 may be coupled to the inlet portion 102 to introduce the liquid 50 into the accommodating space 106, and the flow directing portion 124 may be connected to the inlet pipe portion 122 and may induce a flow of the liquid 50 to suppress the generation of air bubbles due to a drop of the liquid 50 passing through the inlet pipe portion 122.

In some embodiments, the inlet pipe portion 122 may include a full pipe with a side surface entirely closed, or may be a full pipe. For example, the inlet pipe portion 122 may be cylindrical pipe. In another example, the inlet pipe portion may have a pipe structure in various shapes with an empty inside. In some embodiments, an inlet hole may be formed in the inlet portion 102 at the top portion 111, and the inlet pipe portion 112 may be installed to penetrate the top portion 111 through the inlet hole. However, in a modification of this embodiment, a basic pipe for connection with an external pipe may be installed in the inlet portion 102 and the inlet pipe portion 122 may be connected to the basic pipe.

Further, the flow directing portion 124 may have a shape in which at least a part of the inner portion is partially open in a lateral direction. For example, the flow directing portion 124 may have a bar shape extending along one surface of a pipe connected to the inlet pipe portion 122, or a partially curved shape. The flow directing portion 124 may have various shapes to guide the flow of the liquid 50, which will be described below.

In some embodiments, the liquid supply unit 120 may be disposed to vertically extend from an upper side direction to a lower side direction of the tank body 110. For example, the inlet pipe portion 122 may extend vertically into the tank body 110 through the top portion 111, and the flow directing portion 124 may extend vertically from the inlet pipe portion 122 to the lower side direction of the tank body 110. The vertical arrangement of the liquid supply unit 120 may simplify the flow of the liquid 50.

In a modification of this embodiment, the liquid supply unit 120 may extend obliquely from the upper side direction toward the lower side direction of the tank body 110. However, even in this case, the liquid supply unit 120 may be disposed to be inclined at a predetermined angle to an extent that an extended line of the flow directing portion 124 does not touch the lateral portion 113. Therefore, the liquid 50 flowing along the flow directing portion 124 may reach a surface level without flowing to the lateral portion 113.

Hereinafter, the flow of the fluid through the flow directing portion 124 will be described in further detail.

Figure 2:
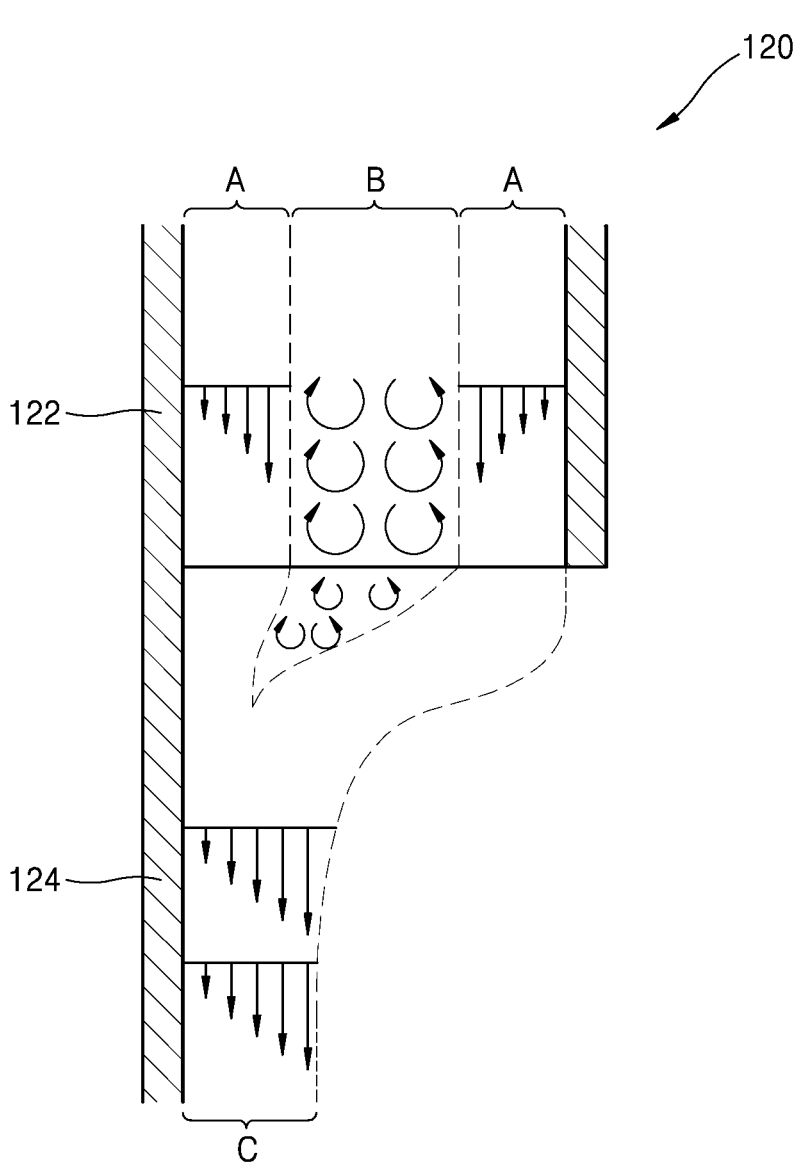
FIG. 2 is a schematic diagram illustrating a flow of liquid through a liquid supply unit in the liquid trap tank of FIG. 1.

FIG. 2 is a schematic diagram showing the flow of liquid through the liquid supply unit 120 in the liquid trap tank of FIG. 1.

Referring to FIG. 2, in an ideal situation, in the inlet pipe portion 122, a laminar flow region A in which the liquid 50 flows along the wall surface may be formed in an edge portion adjacent to the wall surface and a turbulent flow region B in which the liquid 50 does not flow in one direction may be formed at a central portion. On the other hand, since the inner portion of the flow directing portion 124 is open rather than closed, a laminar flow region C may be formed generally along the wall surface. The turbulent flow region B may gradually disappear at the boundary between the inlet pipe portion 122 and the flow directing portion 124. However, the laminar flow regions A and C and the turbulent flow region B described above represent an ideal situation, and it is not excluded that partial turbulence is also formed in the laminar flow regions A and C in practice.

The formation of the laminar regions A and C may be related to the viscosity, flow rate, or the like of the liquid 50. For example, as the viscosity of the liquid 50 is high and the flow rate is low, the area of the laminar flow regions A and C may increase and the area of the turbulent flow region B may be narrowed. Conversely, as the viscosity of the liquid 50 is low and the flow velocity is high, the area of the laminar flow regions A and C may be narrowed and the area of the turbulent flow region B may increase. In this regard, the shape of the flow directing portion 124 may be selected in consideration of the viscosity or flow rate of the liquid 50.

Accordingly, the flow directing portion 124 may serve to guide the flow of the liquid 50 when the level of the liquid 50 is lowered, and may induce a laminar flow of the liquid 50 in an ideal situation. Since the liquid 50 flows along the wall surface, the flow directing portion 124 may allow the generation of air bubbles in the liquid 50 to be suppressed and furthermore, allow the air bubbles generated in the liquid 50 to disappear while flowing along the wall surface.

Referring to FIGS. 1 and 2, since the liquid 50 through the inlet pipe portion 122 is supplied to the surface of the liquid 50 to be accommodated while flowing along the flow directing portion 124 and forming a laminar flow, the liquid 50 may be prevented from directly dropping, thereby suppressing the generation of the air bubbles in the liquid 50. Furthermore, when the level of the liquid 50 is lower than the inlet pipe portion 122, previously generated air bubbles may be provided to the flow directing portion 124 through the inlet pipe portion 122. As the liquid 50 flows along the flow directing portion 124, a significant amount of the air bubbles may disappear.

Figure 3:
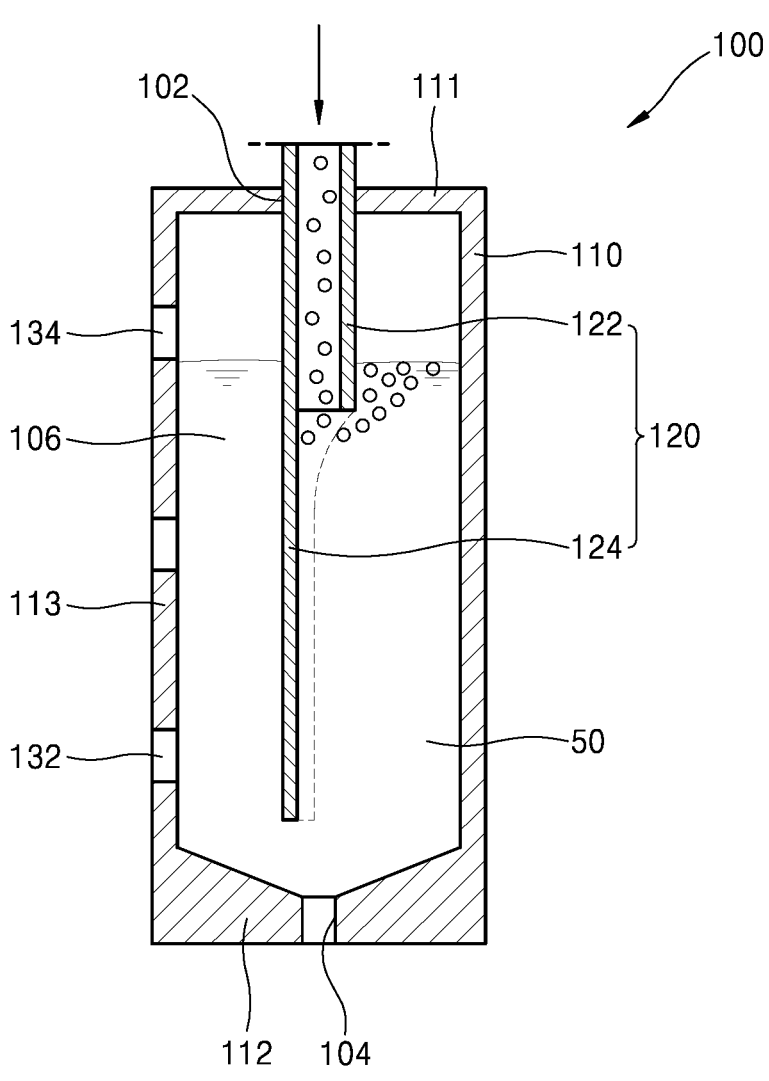
FIG. 3 is a schematic cross-sectional view showing the liquid supply at a full level in the liquid trap tank of FIG. 1.

As shown in FIG. 3, in some embodiments, the inlet pipe portion 122 may penetrate through the top portion 111 of the tank body 110 and extend up to below the full level of the tank body 110. Accordingly, in a full level situation, for example, in a situation where the liquid 50 is filled to a lower end of the full level indicating portion 134, a lower end of the inlet pipe portion 122 is submerged in the liquid 50 and the entire flow directing portion 124 is submerged in the liquid 50.

This structure allows the suction force transferred to the outlet portion 104 to be transferred to the inlet pipe portion 122 when the liquid 104 is discharged through the outlet portion 104, so that the liquid 50 in an amount equal to the amount discharged from the outlet portion 104 can be naturally sucked into the accommodating space 106 from the outside through the inlet pipe portion 122.

Additionally, when the liquid 50 is accommodated up to the full level in the tank body 110, the previously generated air bubbles may pass through the inlet pipe portion 122 and then be directly injected into the liquid 50 through an exposed portion of the flow directing portion 124. The air bubbles injected into the liquid 50 may permeate to a predetermined depth and then immediately rise to the surface and be removed. Thus, it is necessary to control the height of the inlet pipe portion 122 such that the previously generated air bubbles injected into the liquid 50 through the inlet pipe portion 122 can rise to the upper side of the tank body 110 in this structure without directing toward the outlet portion 104.

For example, a lower end of the inlet pipe portion 122 may be located at a position higher than the middle of the tank body 110, and accordingly, the flow directing portion 124 may be connected to the inlet pipe portion 122 above the middle of the tank body 110. More specifically, the inlet pipe portion 122 may extend to just below the full level of the tank body 110 and the flow directing portion 124 may be connected to the inlet pipe portion 122 at a portion closer to the full level than the middle of the tank body 110.

In some embodiments, the liquid 50 is initially filled in the tank body 110, the flow directing portion 124 may allow the liquid 50 to flow while forming a laminar flow along the surface of the flow directing portion 124, thereby suppressing the generation of air bubbles. Furthermore, when the liquid 50 is accommodated up to the full level indicating portion 134, the filling may be stopped and the liquid 50 may be discharged through the outlet portion 104. In this case, the liquid 50 in an amount equal to the discharged amount is re-filled into the tank body 110 in a natural intake manner through the liquid supply unit 120 and the previously generated air bubbles may be injected into the liquid 50 from the inlet pipe portion 122 and exhausted to the surface of the liquid 50 to be removed.

Hereinafter, various modifications of the liquid supply unit 120 for the liquid trap tank 100 will be described.

FIGS. 4A to 4E are schematic views of liquid supply units 120a, 120b, 120c, 120d, and 120e for a liquid trap tank according to embodiments of the present disclosure. The liquid supply units 120a, 120b, 120c, 120d, and 120e are formed by modifying some configurations of the liquid supply unit 120 of FIG. 1 or adding configurations to the liquid supply unit 120, and may be referenced to each other. Hence, redundant descriptions thereof will be omitted.

Figure 4A:
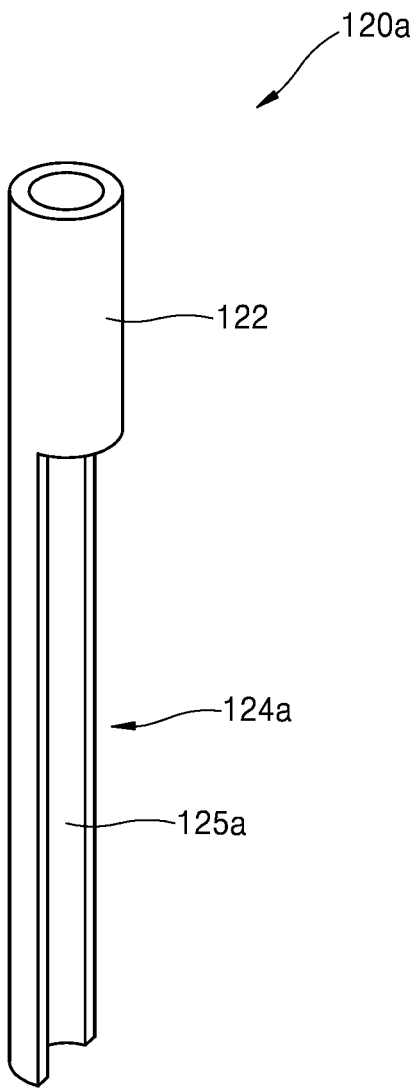
FIGS. 4A to 4E are schematic views of a liquid supply unit for a liquid trap tank according to embodiments of the present disclosure.

Referring to FIG. 4A, the liquid supply unit 120a may include an inlet pipe portion 122 and a flow directing portion 124a. The inlet pipe portion 122 may be a full pipe with a side surface entirely closed, and the flow direction portion 125a may include a partial pipe having a shape in which at least a part of an inner portion is partially open in a lateral direction.

More specifically, in the liquid supply unit 120a, the entire flow directing portion 124a may be configured as the partial pipe 125a. That is, the partial pipe 125a may be formed along the entire length from the upper end and the lower end of the flow directing portion 124a. For example, the partial pipe 125a may be formed such that the inside thereof is partially open by removing a portion of a full pipe.

In some embodiments, the partial pipe 125a may be a half pipe exposed in the lateral direction thereof. For example, the partial pipe 125a may be formed of a remaining half pipe after removing half of a cylindrical full pipe. The width of an open portion of the partial pipe 125a may be adjusted in consideration of the degree of laminar flow, for example, viscosity or the like, of the liquid 50.

According to the structure of the liquid supply unit 120a, when the level of the liquid 50 in the tank body 110 is lowered, the liquid 50 through the inlet pipe portion 122 may flow while forming a laminar flow along a curved surface of the partial pipe 125a of the flow directing portion 124a. Therefore, the liquid supply unit may be coupled to the liquid trap tank 100 and be efficiently used to suppress the generation of air bubbles and to remove previously generated air bubbles.

Figure 4B:
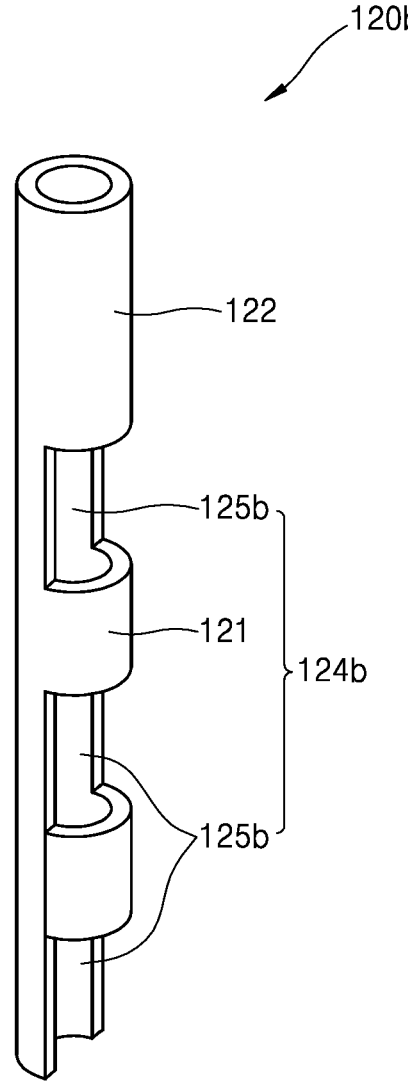

Referring to FIG. 4B, the liquid supply unit 120b may include an inlet pipe portion 122 and a flow directing portion 124b. The inlet pipe portion 122 may be a full pipe with a side surface entirely closed, and the flow direction portion 125b may include at least one partial pipe having a shape in which at least a part of an inner portion is partially open in a lateral direction. In some embodiments, as described with reference to FIG. 3, the partial pipe 125b may be formed at least at an upper end of the flow directing portion 124b in order to remove air bubbles to the surface.

More specifically, in the liquid supply unit 120b, a plurality of partial pipes 125b may be formed along the length direction of the flow directing portion 124b and spaced apart from each other. For example, the flow directing portion 124b may include a plurality of full pipes 121 and a plurality of partial pipes 125b. The plurality of full pipes 121 and the plurality of partial pipes 125b may be alternately arranged. The length of each partial pipe 125b may be set to a length sufficient to induce a laminar flow in consideration of the viscosity of the liquid 50. For example, the flow directing portions 124b may be formed by partially removing the full pipes 121 at a plurality of portions.

According to the structure of the liquid supply unit 120b, the liquid 50 through the inlet pipe portion 122 may flow while forming a laminar flow along curved surfaces of the partial pipes 125a of the flow directing portion 124b and the laminar flow may be maintained to some extent even when passing through the full pipes 121.

Figure 4C:
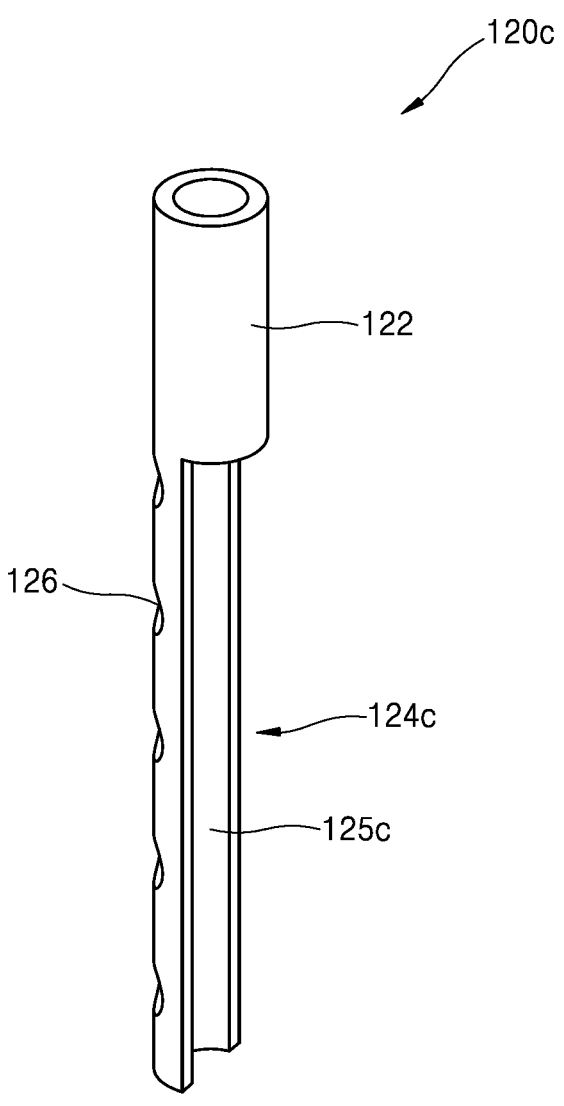

Referring to FIG. 4C, the liquid supply unit 120c may include an inlet pipe portion 122 and a flow directing portion 124c. A partial pipe 125c of the flow directing portion 124c may be similar to the partial pipe 125a of FIG. 4A, except that the flow directing portion 124c may have a perforation hole 126 in at least a portion of an inner surface to reduce the flow rate of the liquid 50. For example, a plurality of perforation holes may be formed along the longitudinal direction of the partial pipe 125c. The perforation holes 126 may further slow the flow rate of the liquid 50 through the partial pipe 125c, so that the laminar flow can be stably maintained.

Figure 4D:
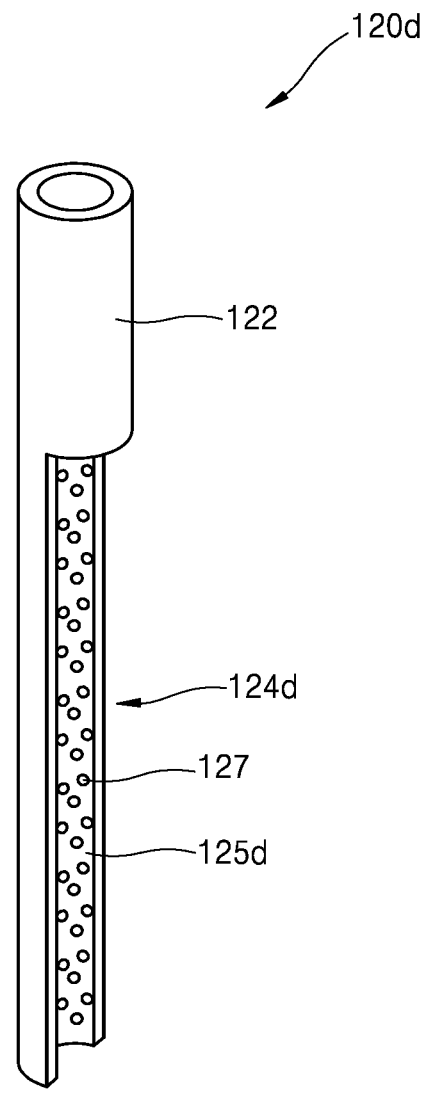

Referring to FIG. 4D, the liquid supply unit 120d may include an inlet pipe portion 122 and a flow directing portion 124d. A partial pipe 125d of the flow directing portion 124d may be similar to the partial pipe 125a of FIG. 4A, except that the flow directing portion 124d may have protrusions 127 in at least a portion of an inner surface to reduce the flow rate of the liquid 50. For example, the protrusions 127 may be formed in a pattern on a wall surface of the partial pipe 125d. The protrusions 127 may further slow the flow rate of the liquid 50 through the partial pipe 125d, so that the laminar flow can be stably maintained.

Meanwhile, in a modification of this embodiment, grooves may be formed in a pattern instead of the protrusions 127 in the liquid supply unit 120d.

Figure 4E:
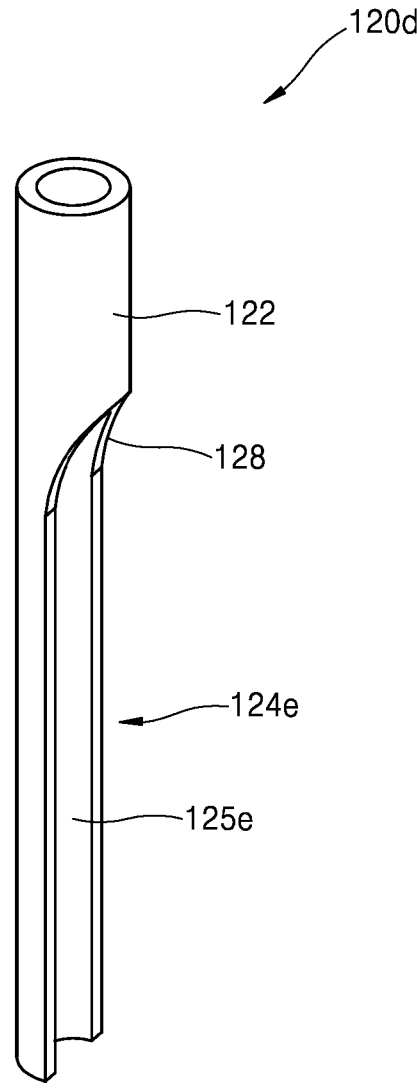

Referring to FIG. 4E, the liquid supply unit 120e may include an inlet pipe portion 122 and a flow directing portion 124e. A partial pipe 125e of the flow directing portion 124e may include an inclined connecting portion to remove a step difference in the upper end connected to the inlet pipe portion 122. The inclined connecting portion 128 may help the liquid 50 passing through the inlet pipe portion 122 to be smoothly connected to the partial pipe 125e without dropping.

In some embodiments, the perforation holes 126, the protrusions 127, the inclined connecting portion 128, etc. In the above-described liquid supply units 120a, 120b, 120c, 120d, and 120e for a liquid trap tank may be configured in combination with each other in other embodiments.

Figure 5:
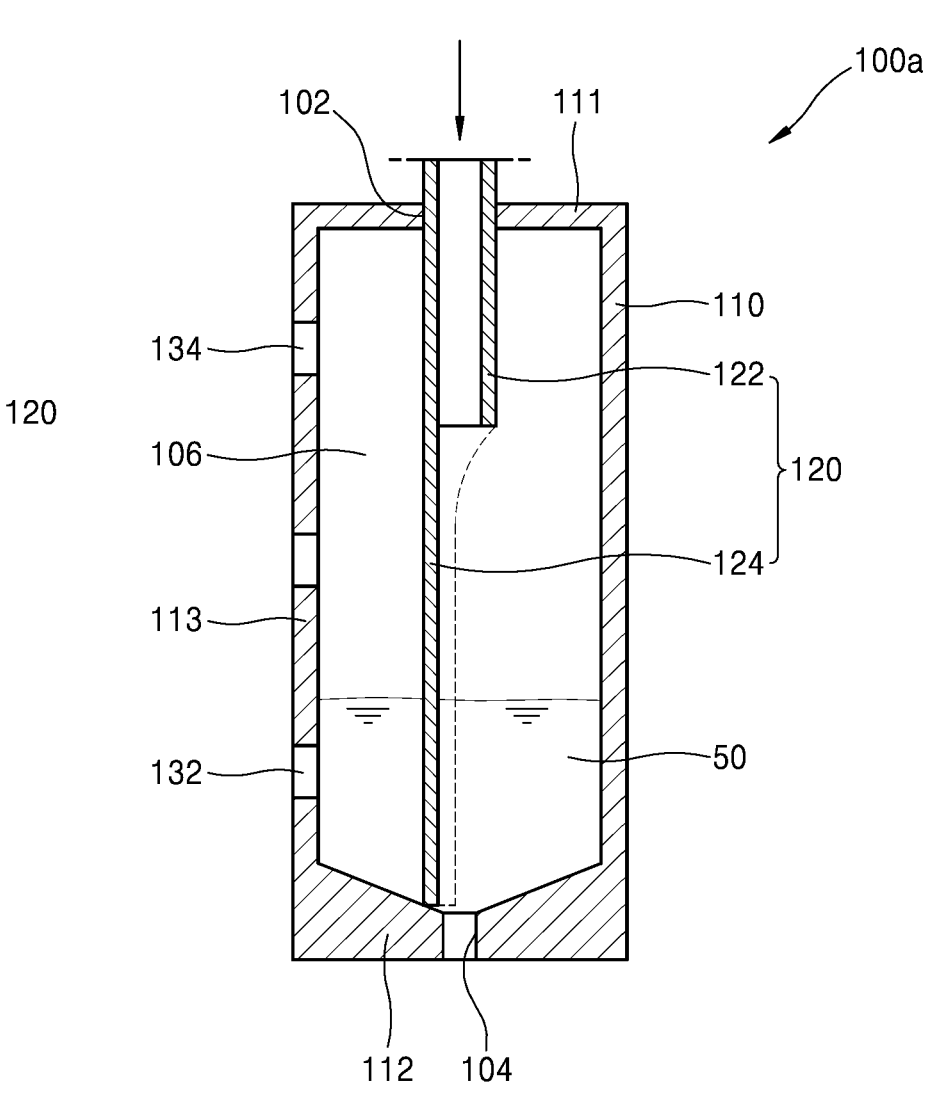
FIG. 5 is a schematic cross-sectional view of a liquid trap tank according to another embodiment of the present disclosure.

FIG. 5 is a schematic cross-sectional view of a liquid trap tank 100a according to another embodiment of the present disclosure. The liquid trap tank 100a is formed by modifying some configurations of the liquid trap tank 100 of FIG. 1, and may be referenced to each other. Hence, redundant descriptions thereof will be omitted.

Referring to FIG. 5, a liquid supply unit 120 in the liquid trap tank 100a may be in contact with a bottom surface of a tank body 110. For example, a flow directing portion 124 may extend to the bottom surface of the tank body 110 so that a lower end thereof is in contact with the bottom surface. In this case, even when the liquid 50 in the tank body 110 is lowered to the lowest level, the liquid supply unit may maintain a laminar flow of the liquid 50.

Figure 6:
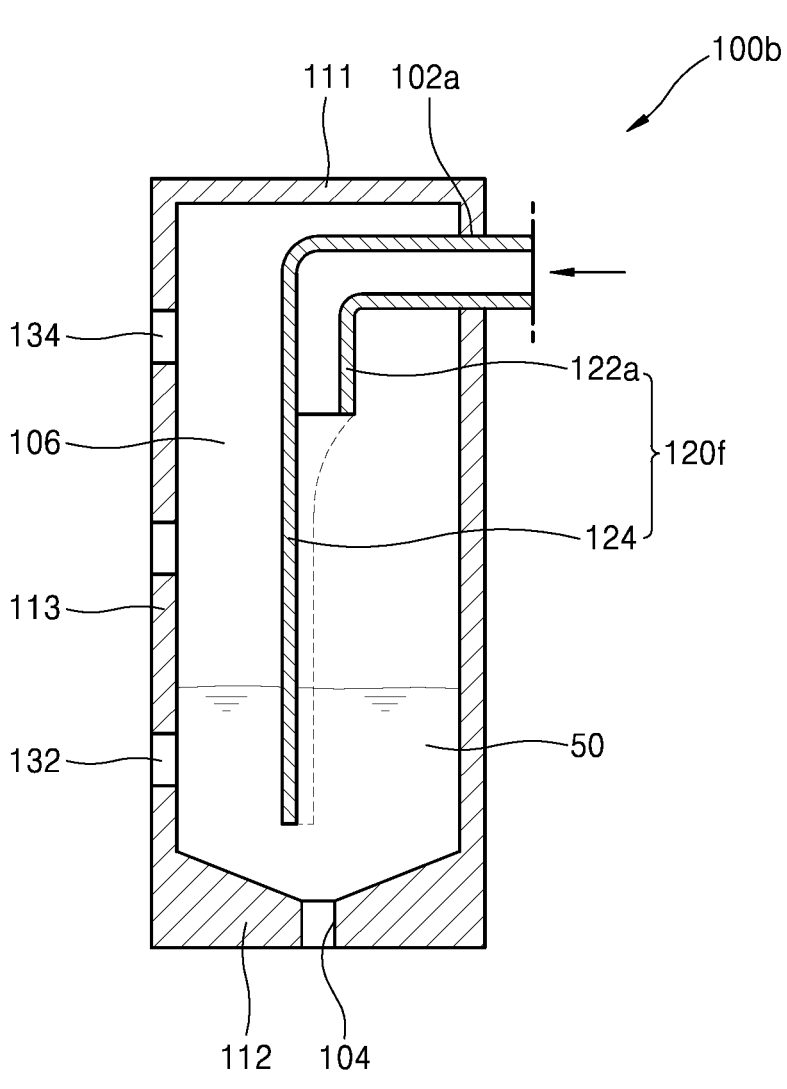
FIG. 6 is a schematic cross-sectional view of a liquid trap tank according to another embodiment of the present disclosure.

FIG. 6 is a schematic cross-sectional view of a liquid trap tank 100*b* according to another embodiment of the present disclosure. The liquid trap tank 100*b* is formed by modifying some configurations of the liquid trap tank 100 of FIG. 1, and may be referenced to each other. Hence, redundant descriptions thereof will be omitted.

Referring to FIG. 6, a liquid supply unit 120*f* in the liquid trap tank 100*b* may include a fluid inlet portion 122*a* and a flow directing portion 124. The inlet portion 102*a* may be formed on a lateral portion 113 of a tank body 110, and accordingly, the fluid inlet portion 122*a* may be coupled to the lateral portion 113 of the tank body 110. The fluid inlet portion 122*a* may penetrate through the lateral portion 113 of the tank body 110, extend into the tank body 110, and then be bent downward and extend.

According to the liquid trap tank 100*b*, the structure of the fluid inlet portion 122*a* is somewhat complicated, but since the liquid 50 flows while forming a laminar flow through the flow directing portion 124, the generation of air bubbles may be suppressed or air bubbles may be removed.

Figure 7:
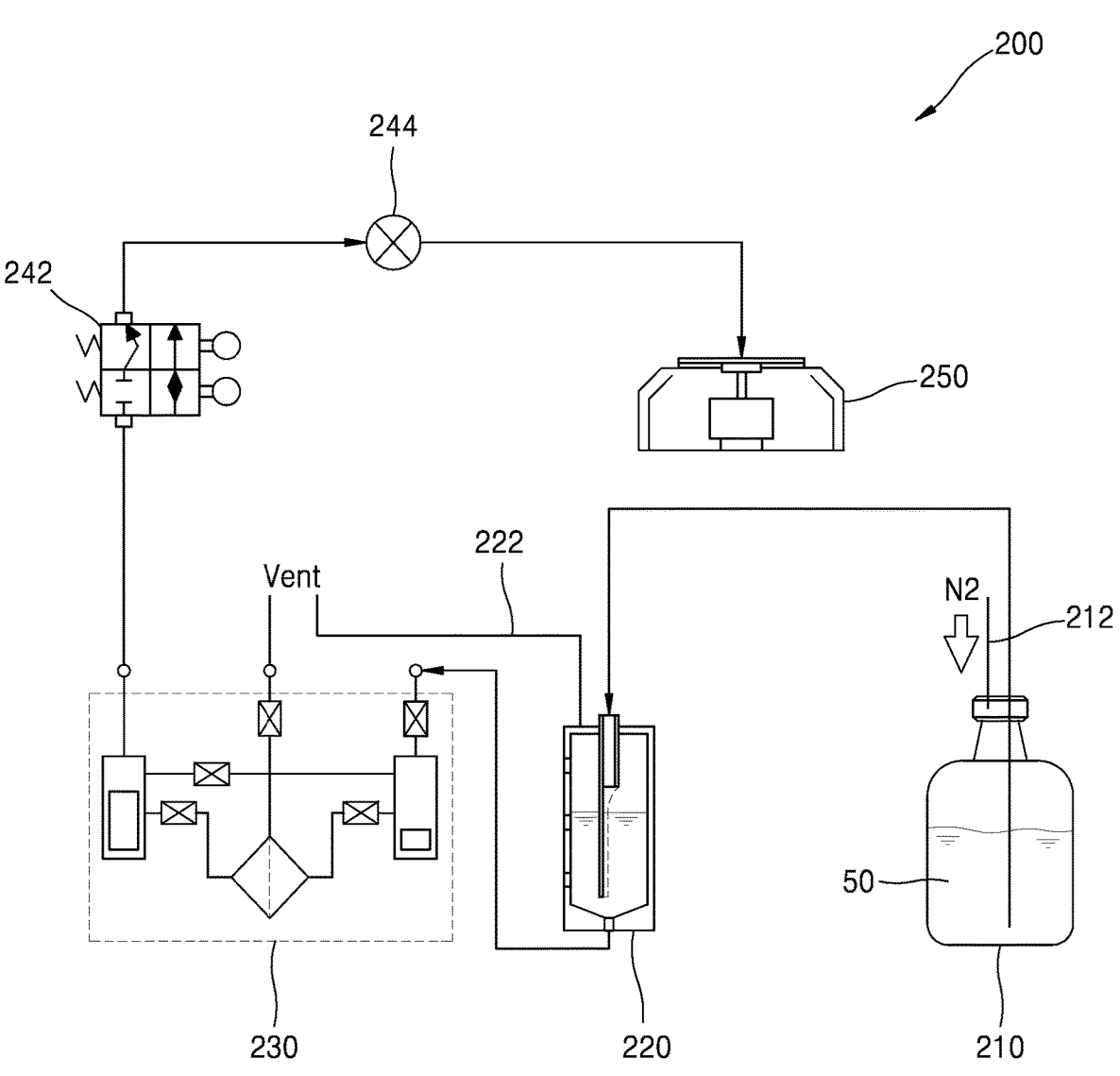
FIG. 7 is a schematic diagram showing a liquid supply system using a liquid trap tank according to embodiments of the present disclosure.

FIG. 7 is a schematic diagram showing a liquid supply system 200 using a liquid trap tank according to embodiments of the present disclosure.

Referring to FIG. 7, the liquid supply system 200 may include a liquid storage bottle 210, a liquid trap tank 220, and a pumping unit 230.

More specifically, the liquid storage bottle 210 may store a liquid 50 and may be replaced on a bottle-by-bottle basis after use. Optionally, a gas injection line 212 may be connected to the liquid storage bottle 210 to pressurize and discharge the liquid 50.

The liquid trap tank 220 may be any one of the liquid trap tanks 100, 100*a*, and 110*b* described above with reference to FIGS. 1 to 6. The pumping unit 230 may be provided to pump the liquid 50 from the liquid storage bottle 210 to a substrate treatment apparatus 250. For example, an outlet portion (e.g., 104 in FIG. 1) of the liquid trap tank 220 may be connected to the pumping unit 230 for pumping the liquid to the substrate treatment apparatus 250, and an inlet portion (e.g., 102 in FIG. 1) of the liquid trap tank 220 may be connected to the liquid storage bottle 210 that stores the liquid 50.

The liquid trap tank 220 may be interposed between the liquid storage bottle 210 and the pumping unit 230 to store the liquid 50 supplied from the liquid storage bottle 210 before supplying the liquid to the pumping unit 230. For example, the liquid trap tank 220 may suppress the generation of air bubbles or remove air bubbles when the liquid 50 is initially supplied from the liquid storage bottle 210 or when the liquid storage bottle 210 is replaced after the liquid 50 therein is used up. Accordingly, the liquid 50 in the liquid storage bottle 210 may be used until empty, so that the remaining amount of the liquid 50 can be minimized.

A valve 242 and a flow meter 244 may be interposed between the pumping unit 230 and the substrate treatment apparatus 250. For example, the valve 242 may be provided as a suck-back valve to control the discharge of the liquid 50 in a constant amount. When the pumping unit 230 is operated, suction force may be transferred to the liquid storage bottle 210 through the liquid trap tank 220. Accordingly, when the liquid 50 is pumped from the liquid trap tank 220 and transferred to the substrate treatment apparatus 250, a liquid level of the liquid trap tank 220 is reduced and the liquid 50 in an amount equal to the discharged amount may be naturally provided from the liquid storage bottle 210 to the liquid trap tank 220.

In some embodiments, when the liquid level in the liquid trap tank 220 is lowered and the transmission of the suction force is weakened, an inert gas, such as nitrogen gas, may be injected into the liquid storage bottle 210 through the gas injection line 212, thereby supplying the liquid 50 from the liquid storage bottle 210 to the liquid trap tank 220.

In some embodiments, a venting line 222 may be connected to the liquid trap tank 220 to discharge air or the liquid 50. The venting line 222 may be added to the liquid trap tanks 100, 100*a*, and 100*b* described above. Additionally, the venting line 222 may also be connected to the pumping unit 230.

The substrate treatment apparatus 250 may be provided with various devices for treating a substrate using the liquid 50. For example, the substrate treatment apparatus 250 may include a photo-track facility for spin-coating a substrate with a photoresist chemical as the liquid 50. However, the scope of the present disclosure is not limited to the photo-track facility, and the liquid supply system may be used for substrate treatment using the liquid 50 in various ways.

The above-described liquid supply system 200 supplies the liquid 50 in which the generation of air bubbles is suppressed or the air bubbles are removed to the substrate treatment apparatus 250 by using the liquid trap tank 220 described above, thereby improving the substrate treatment performance.

According to an embodiment of the present disclosure, a liquid trap tank which can suppress the generation of air bubbles or remove the air bubbles and a liquid supply unit for the liquid trap tank may be provided. However, the scope of the present disclosure is not limited to the above-described effects.

While the present disclosure has been particularly shown and described with reference to embodiments thereof, it will be understood by one of ordinary skill in the art that various changes in form and details may be made therein without departing from the scope of the present disclosure as defined by the following claims.

What is claimed is:

1. A liquid trap tank comprising:
   a tank body which has an accommodating space formed therein to accommodate a liquid and has an inlet portion formed on one side and an outlet portion formed on an opposite side; and
   a liquid supply unit coupled to the inlet portion of the tank body to supply the liquid from the outside of the tank body to the accommodating space,
   wherein the liquid supply unit comprises:
   an inlet pipe portion coupled to the inlet portion to introduce the liquid into the accommodating space; and
   a flow directing portion connected to the inlet pipe portion and configured to induce a flow of the liquid to suppress generation of air bubbles due to a drop of the liquid passing through the inlet pipe portion,
   wherein the inlet pipe portion is a full pipe with a side surface entirely closed and the flow directing portion comprises a partial pipe having a shape in which at least a part of an inner portion is partially open in a lateral direction,
   wherein a plurality of partial pipes are formed to be spaced apart from each other in a longitudinal direction of the flow directing portion.

2. The liquid trap tank of claim 1, wherein the flow directing portion extends vertically from an upper side direction to a lower side direction of the tank body and the partial pipe is formed along an entire length from an upper end to a lower end of the flow directing portion.

3. The liquid trap tank of claim 1, wherein a lower end of the flow directing portion is in contact with a bottom surface of the tank body.

4. The liquid trap tank of claim 1, wherein the flow directing portion further comprises any one of a perforation hole and a protrusion pattern or a combination thereof on at least a portion of an inner surface thereof in order to reduce a flow rate of the liquid.

5. The liquid trap tank of claim 1, wherein:

the inlet portion is formed at a top portion of the tank body, the outlet portion is formed at a bottom portion of the tank body, and the inlet pipe portion penetrates through the top portion of the tank body and extends up to below a full level of the tank body so that the liquid in an amount equal to an amount discharged through the outlet portion can be naturally sucked in through the inlet portion.

6. The liquid trap tank of claim 5, wherein the flow directing portion is connected to the inlet pipe portion above a middle point of the tank body so that air bubbles introduced through the inlet pipe portion can rise to the top portion of the tank body without moving toward the outlet portion.

7. The liquid trap tank of claim 1, wherein the flow directing portion further comprises an inclined connecting portion to remove a step difference in an upper end connected to the inlet pipe portion, and wherein the middle point is configured between the top portion of the tank body and the bottom portion of the tank body.

8. The liquid trap tank of claim 1, wherein the outlet portion is connected to a pumping unit configured to pump the liquid to a substrate treatment apparatus and the inlet portion is connected to a liquid storage bottle that stores the liquid.

9. The liquid trap tank of claim 1, wherein the liquid comprises a photoresist chemical.

10. A liquid supply unit for a liquid trap tank, which is coupled to an inlet portion of a tank body that has an accommodating space formed therein to accommodate a liquid and has the inlet portion formed on one side and an outlet portion formed on an opposite side and configured to supply the liquid to the accommodating space from the outside of the tank body, the liquid supply unit comprising:

an inlet pipe portion coupled to the inlet portion to introduce the liquid into the accommodating space; and a flow directing portion connected to the inlet pipe portion and configured to induce a laminar flow of the liquid to suppress generation of air bubbles due to a drop of the liquid passing through the inlet pipe portion, wherein the inlet pipe portion is a full pipe with a side surface entirely closed, and the flow directing portion comprises a partial pipe having a shape in which at least a part of an inner portion is partially open in a lateral direction, wherein a plurality of partial pipes are formed to be spaced apart from each other in a longitudinal direction of the flow directing portion.

11. The liquid supply unit of claim 10, wherein the partial pipe is formed at least at an upper end of the flow directing portion.

12. The liquid supply unit of claim 10, wherein the flow directing portion extends vertically from an upper side direction to a lower side direction of the tank body and the partial pipe is formed along an entire length from an upper end to a lower end of the flow directing portion.

13. The liquid supply unit of claim 10, wherein the flow directing portion further comprises an inclined connecting portion to remove a step difference in an upper end connected to the inlet pipe portion, wherein a middle point is configured between a top portion of the tank body and a bottom portion of the tank body.

14. A liquid trap tank comprising:

a tank body which has an accommodating space formed therein to accommodate a liquid and has an inlet portion on one side thereof which is connected to a liquid storage bottle and an outlet portion on an opposite side which is connected to a pumping unit; and a liquid supply unit coupled to the inlet portion of the tank body to supply the liquid from the outside of the tank body to the accommodating space, wherein the liquid supply unit comprises:

an inlet pipe portion coupled to the inlet portion, extending into the accommodating space to introduce the liquid into the accommodating space, and comprising a full pipe with a side surface entirely closed; and a flow directing portion connected to the inlet pipe portion in the accommodating space, vertically extending from an upper side direction to a lower side direction of the tank body, and including a partial pipe having a shape in which an entire inner portion from an upper end to a lower end is partially open in a lateral direction such that a flow of the liquid can be induced to suppress the generation of air bubbles due to a drop of the liquid passing through the inlet pipe portion, the inlet pipe portion extends below a full level of the tank body so that the liquid in an amount equal to the amount discharged through the outlet portion can be naturally sucked in through the inlet portion, the flow directing portion is connected to the inlet pipe portion above a middle point of the tank body so that air bubbles introduced through the inlet pipe portion can rise to an upper portion of the tank body without moving toward the outlet portion, wherein a plurality of partial pipes are formed to be spaced apart from each other in a longitudinal direction of the flow directing portion.

\* \* \* \* \*